(12) United States Patent
Oboukhov et al.

(10) Patent No.: US 10,592,334 B2
(45) Date of Patent: Mar. 17, 2020

(54) DATA STORAGE DEVICE EMPHASIZING PARITY SECTOR PROCESSING OF UN-CONVERGED CODEWORDS

(71) Applicant: Western Digital Technologies, Inc., San Jose, CA (US)

(72) Inventors: Iouri Oboukhov, Rochester, MN (US); Niranjay Ravindran, Rochester, MN (US); Richard L. Galbraith, Rochester, MN (US)

(73) Assignee: Western Digital Technologies, Inc., San Jose, CA (US)

( * ) Notice: Subject to any disclaimer, the term of this patent is extended or adjusted under 35 U.S.C. 154(b) by 111 days.

(21) Appl. No.: 15/983,016

(22) Filed: May 17, 2018

(65) Prior Publication Data
US 2019/0354430 A1 Nov. 21, 2019

(51) Int. Cl.
| | |
|---|---|
| *G06F 11/10* | (2006.01) |
| *H03M 13/41* | (2006.01) |
| *H03M 13/11* | (2006.01) |
| *G11C 29/52* | (2006.01) |

(52) U.S. Cl.
CPC .......... *G06F 11/1068* (2013.01); *G11C 29/52* (2013.01); *H03M 13/1128* (2013.01); *H03M 13/41* (2013.01)

(58) Field of Classification Search
CPC ........... G06F 11/1068; H03M 13/1128; H03M 13/41; G11C 29/52
USPC ....................................................... 714/764
See application file for complete search history.

(56) References Cited

U.S. PATENT DOCUMENTS

| | | |
|---|---|---|
| 6,047,395 A | 4/2000 | Zook |
| 7,340,665 B2 | 3/2008 | Tsang |
| 8,448,039 B2 | 5/2013 | Gunnam |
| 9,059,737 B2 | 6/2015 | Coker et al. |
| 9,201,731 B2 | 12/2015 | Burd et al. |
| 9,312,886 B2 | 4/2016 | Patapoutian et al. |
| 9,412,410 B1 | 8/2016 | Bentley et al. |

(Continued)

OTHER PUBLICATIONS

R. Lynch, E. Kurtas, A. Kuznetsov, E. Yeo, B. Nikolic "The Search for a Practical Iterative Detector for Magnetic Recording," IEEE Transactions on Magnetics, vol. 40, No. 1, Jan. 2004.

*Primary Examiner* — James C Kerveros (57) ABSTRACT

A data storage device is disclosed comprising a non-volatile storage medium (NVSM), wherein a plurality of codewords and corresponding parity sector are written to the NVSM and then read from the NVSM. Each codeword read from the NVSM is processed using a Viterbi-type detector, thereby generating codeword reliability metrics. The codeword reliability metrics for at least some of the codewords are processed using a low density parity check (LDPC) type decoder, thereby generating a LDPC reliability metric for each symbol of at least one codeword. The LDPC reliability metrics for at least one of an un-converged codeword are processed using the parity sector, thereby updating the un-converged codeword reliability metrics. Processing the codeword reliability metrics with the LDPC decoder and updating the reliability metrics with the parity sector is repeated at least once before updating the LDPC reliability metrics of at least the un-converged codeword using the Viterbi-type detector.

11 Claims, 5 Drawing Sheets

(56) References Cited

U.S. PATENT DOCUMENTS

| | | | |
|---|---|---|---|
| 9,632,863 B2 | 4/2017 | Galbraith et al. | |
| 9,785,504 B2 | 10/2017 | Wu et al. | |
| 2013/0297983 A1* | 11/2013 | Wang | H03M 13/47 714/752 |
| 2014/0068368 A1* | 3/2014 | Zhang | H03M 13/658 714/752 |
| 2015/0143196 A1* | 5/2015 | Zhang | G06F 11/1008 714/758 |
| 2016/0087653 A1* | 3/2016 | Yang | H03M 13/096 714/752 |
| 2017/0324430 A1* | 11/2017 | Han | H03M 13/3476 |

* cited by examiner

DATA STORAGE DEVICE EMPHASIZING PARITY SECTOR PROCESSING OF UN-CONVERGED CODEWORDS

BACKGROUND

Data storage devices such as disk drives, tape drives, and solid state drives typically employ some form of error correction code (ECC) capable of correcting errors when reading the recorded data from the storage medium, thereby compensating for signal noise that is inherent with every recording/reproduction channel. During a write operation, redundancy symbols are generated and appended to user data which are then processed during a corresponding read operation in order to detect and correct errors in the user data.

Figure 1A:
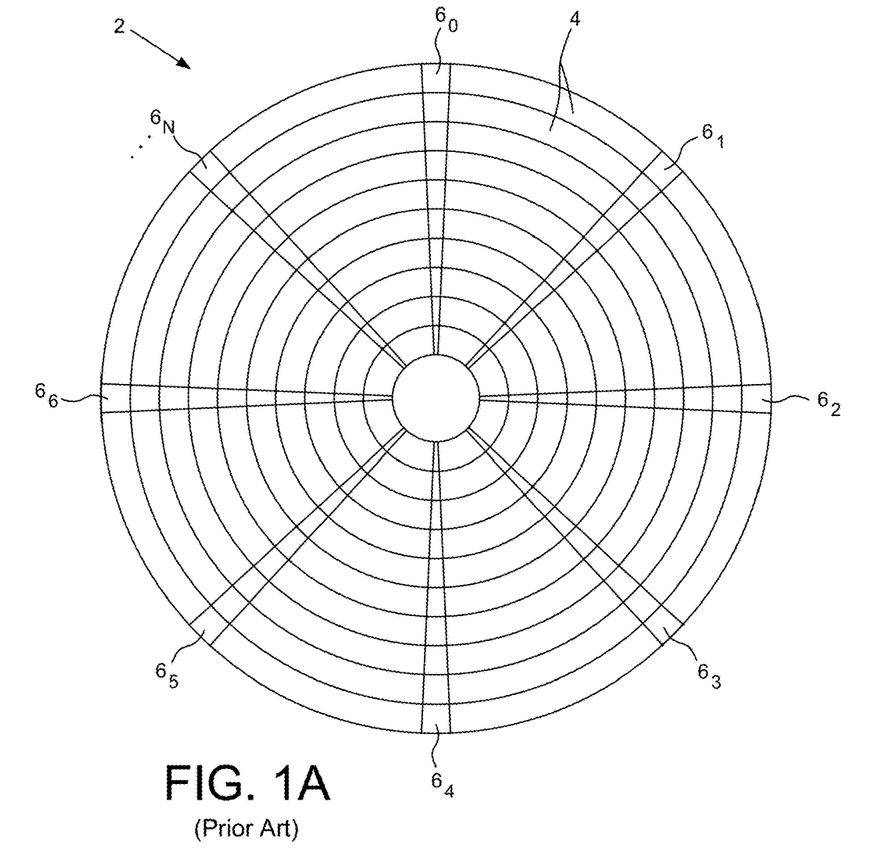
FIG. 1A shows a prior art disk format comprising a plurality of servo tracks defined by servo sectors.
Figure 1B:
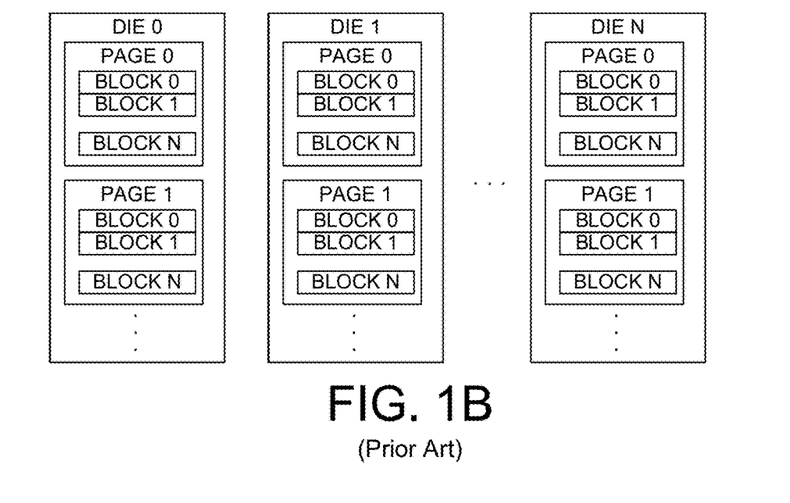
FIG. 1B shows a prior art solid state drive format comprising a plurality of dies each comprising a plurality of pages.

FIG. 1A shows a prior art disk format 2 as comprising a number of servo tracks 4 defined by servo sectors $6_0$-$6_N$ recorded around the circumference of each servo track. Data tracks are defined relative to the servo tracks at the same or different radial density, wherein each data track comprises a plurality of data sectors. Each data sector may store the symbols of a single codeword, or in other embodiments, each data sector may store symbols from multiple codewords (i.e., interleaved codewords). FIG. 1B shows a prior art die format for a solid state drive, wherein each die may store multiple pages and each page may store multiple blocks each corresponding to a data sector of a disk drive.

DETAILED DESCRIPTION

Figure 2A:
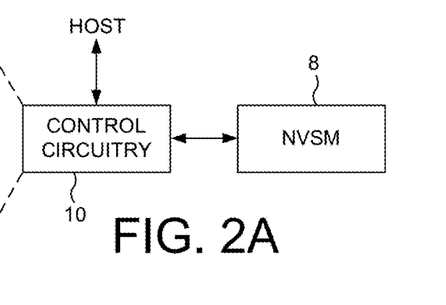
FIG. 2A shows a data storage device according to an embodiment comprising control circuitry and a non-volatile storage medium (NVSM).
Figure 2B:
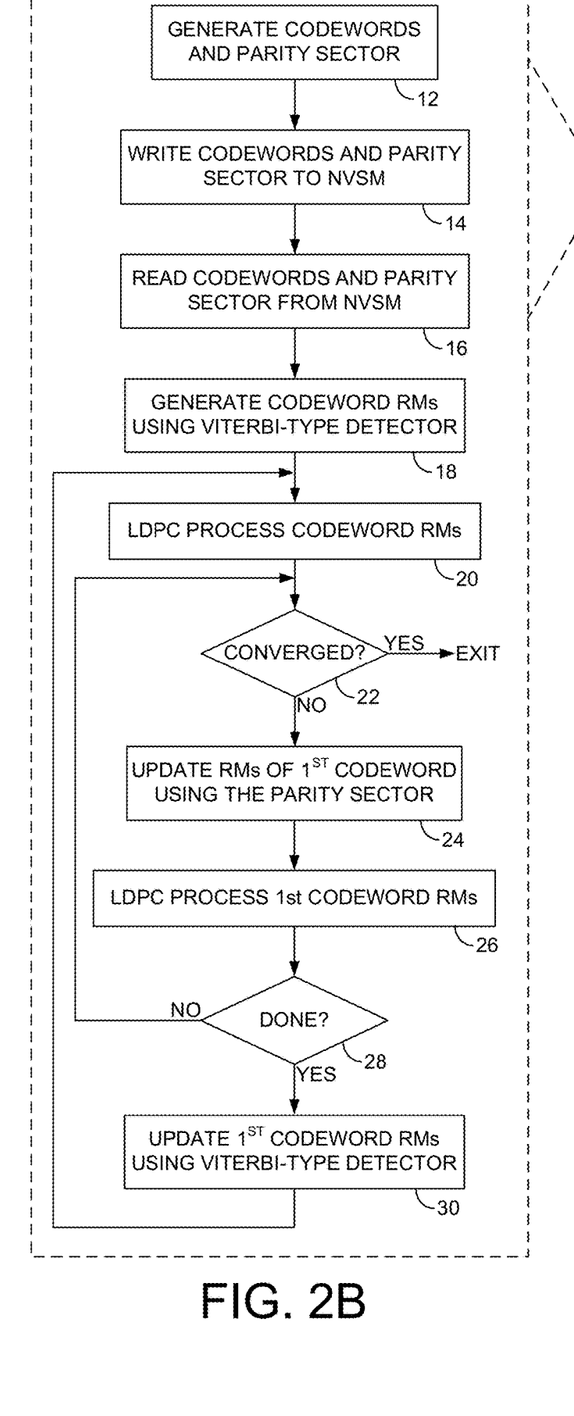
FIG. 2B is a flow diagram according to an embodiment wherein when processing an un-converged codeword, multiple iterations are executed using a parity sector and low density parity check (LDPC) decoder before reprocessing the codeword with a Viterbi-type detector.

FIG. 2A shows a data storage device according to an embodiment comprising a non-volatile storage medium (NVSM) 8, and control circuitry 10 configured to execute the flow diagram of FIG. 2B. The data storage device may include one or more types of NVSM, including rotating magnetic media (e.g., a hard disk drive), magnetic tape media (e.g., tape drive), and solid state memory (e.g., a solid state drive). While the description herein refers to solid state memory generally, it is understood that solid state memory may comprise one or more of various types of memory devices such as flash integrated circuits, Chalcogenide RAM (C-RAM), Phase Change Memory (PC-RAM or PRAM), Programmable Metallization Cell RAM (PMC-RAM or PMCm), Ovonic Unified Memory (OUM), Resistive RAM (RRAM), NAND memory (e.g., Single-Level Cell (SLC) memory, Multi-Level Cell (MLC) memory, TLC, QLC, etc., or any combination thereof), NOR memory, EEPROM, Ferroelectric Memory (FeRAM), Magneto-resistive RAM (MRAM), other discrete NVM chips, or any combination thereof.

Referring to the flow diagram of FIG. 2B, a plurality of codewords each comprising a plurality of symbols are generated, and a parity sector is generated over the plurality of codewords (block 12). The plurality of codewords and the parity sector are written to the NVSM (block 14), and the plurality of codewords and the parity sector are read from the NVSM (block 16). Each codeword read from the NVSM is processed using a Viterbi-type detector, thereby generating codeword reliability metrics (block 18). The codeword reliability metrics for at least some of the codewords are processed using a low density parity check (LDPC) type decoder (block 20), thereby generating a LDPC reliability metric for each symbol of at least one codeword. When there is at least one un-converged codeword (block 22), the LDPC reliability metrics for the un-converged codeword are processed using the parity sector, thereby updating the un-converged codeword reliability metrics (block 24). The updated codeword reliability metrics are then processed by the LDPC-type decoder (block 26), and the flow diagram repeated at least once (block 28) from block 22 without updating any of the LDPC reliability metrics using the Viterbi-type detector. The LDPC reliability metrics of at least the un-converged codeword are then updated using the Viterbi-type detector (block 30), and the flow diagram repeated from block 20 until the codewords converge at block 22 (or until a heroic data recovery procedure is initiated).

Figure 3A:
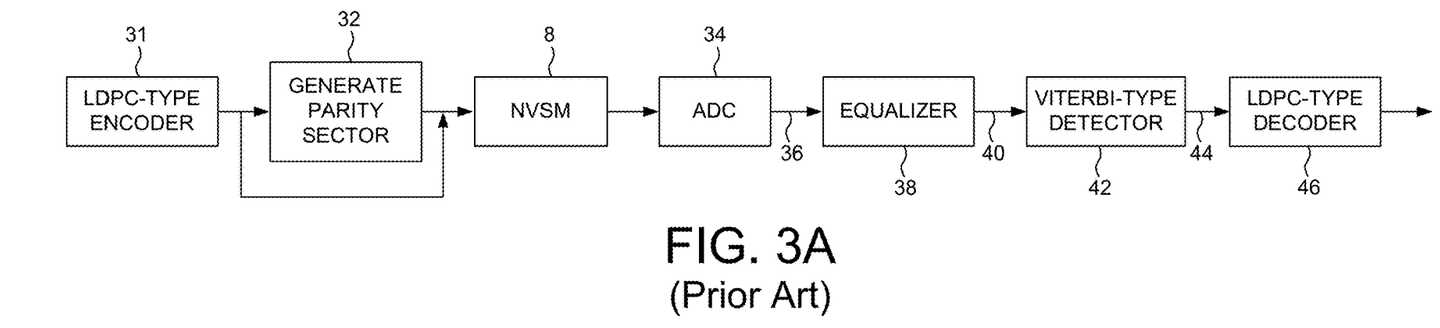
FIGS. 3A and 3B show prior art control circuitry and flow diagram for encoding/decoding codewords, including the use of a parity sector to recover an un-converged codeword.

FIG. 3A shows prior art control circuitry wherein an LDPC-type encoder 31 encodes data into a plurality of codewords. A parity sector is generated (block 32), for example, by XORing the corresponding bits of each codeword. The codewords and the parity sector are written to the NVSM 8. During a read operation, the codewords and the parity sector are read from the NVSM to generate a read signal, and an analog-to-digital converter (ADC) 34 samples the read signal to generate read signal samples 36. The read signal samples 36 are equalized according to a target partial response (block 38) to generate equalized samples 40. A Viterbi-type detector 42 processes the equalized samples 40 to generate a reliability metric 44 (e.g., log-likelihood ratio (LLR)) for each symbol of a corresponding codeword. The LLRs of each codeword are iteratively processed using an LDPC-type decoder 46.

Figure 3B:
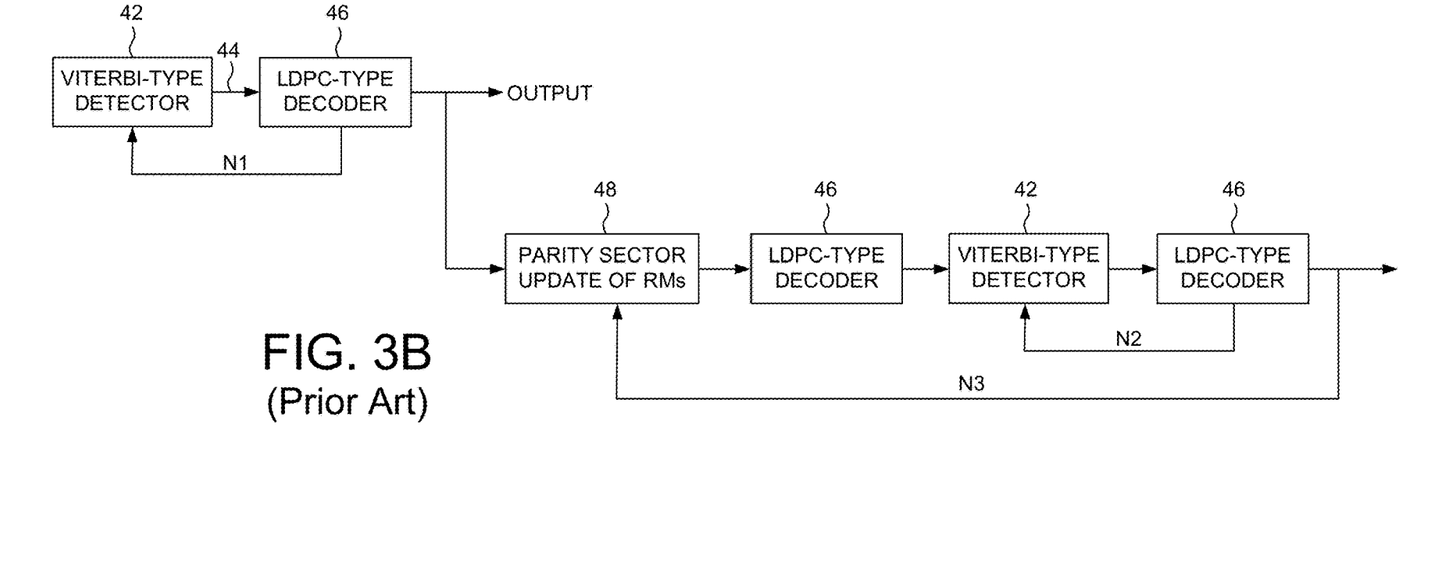

FIG. 3B shows a prior art flow diagram wherein if the LDPC-type decoding fails due to at least one of the codewords failing to converge, the LLRs for at least one of the un-converged codewords are updated using the Viterbi-type detector 42, and the updated LLRs are processed again by the LDPC-type decoder 46. The process of updating the LLRs of an un-converged codeword using the Viterbi-type detector 42 and reprocessing the updated LLRs by the LDPC-type decoder 46 may be repeated N1 number of times. If after the N1 iterations there is still at least one un-converged codeword, the reliability metrics of the un-converged codeword(s) are updated using the parity sector 48. The updated reliability metrics are then processed by the LDPC-type decoder 46, and if still not converged, updated again by the Viterbi-type detector 42. The Viterbi-type processing and LDPC processing may be repeated N2 number of times. If after the N2 iterations there is still at least one un-converged codeword, the flow diagram may be repeated (N3 number of times) by again updating the reliability metrics using the parity sector 48. During the N3 iterations, all of the codewords may converge in which case the flow diagram will terminate. If after the N3 iterations there is still at least one un-converged codeword, the control circuitry may execute a heroic data recover procedure (e.g., by rereading the data from the disk) in an attempt to recover the un-converged codedword(s).

The inventors of the present application have identified a drawback with the prior art flow diagram of FIG. 3B in that updating the reliability metrics of an un-converged codeword using the Viterbi-type detector during the N2 iterations may be less effective than updating the reliability metrics using the parity sector. This may be because the Viterbi-type detector 42 updates the reliability metrics in a manner that compensates for signal noise due to inter-symbol interference (ISI) which may actually increase the overall signal noise, whereas updating the reliability metrics using the parity sector 48 compensates for essentially all sources of signal noise. Accordingly, in one embodiment when processing un-converged codeword(s) more emphasis is placed on updating the reliability metrics using the parity sector 48 rather than emphasizing the Viterbi-type update of the reliability metrics as in the prior art flow diagram of FIG. 3B.

Figure 4A:
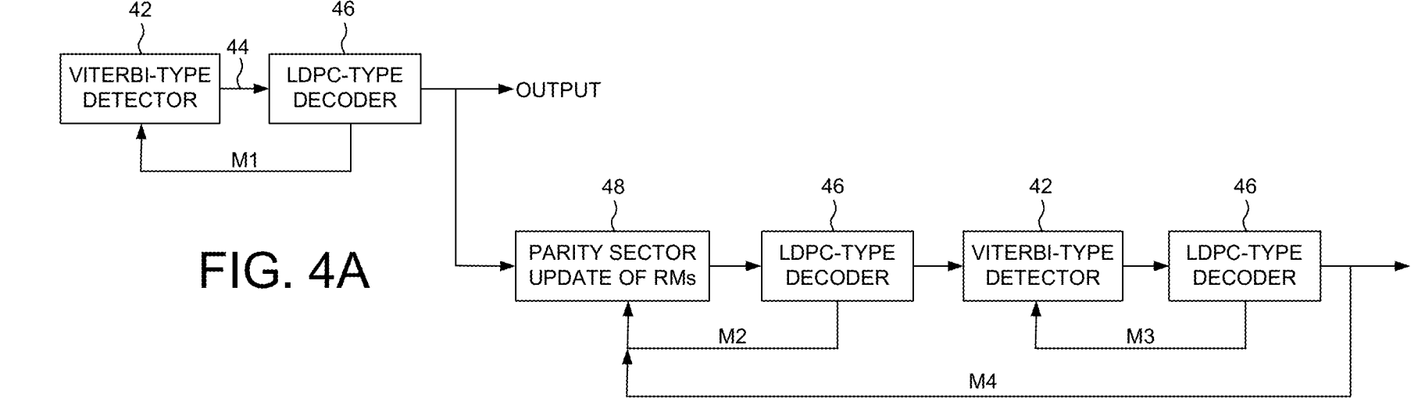
FIG. 4A is a flow diagram according to an embodiment wherein when processing an un-converged codeword, multiple iterations are executed using a parity sector and LDPC decoder between executing at least one iteration of a Viterbi-type detector and LDPC decoder.

FIG. 4A is a flow diagram according to an embodiment wherein when there is at least one un-converged codeword after M1 iterations of the Viterbi-type detector 42 and the LDPC-type decoder 46, the reliability metrics of an un-converged codeword are updated using the parity sector 48, and the updated reliability metrics are processed by the LDPC-type decoder 46. The parity sector update and LDPC decoding is repeated at least one time (M2 iterations) without updating any of the LDPC reliability metrics using the Viterbi-type detector 42. If after the M2 iterations there is still at least one un-converged codeword, the LDPC reliability metrics are processed by the Viterbi-type detector 42 and by the LDPC decoder 46 over M3 iterations. If after the M3 iterations there is still at least one un-converged codeword, the flow diagram is repeated over M4 iterations by again updating the reliability metrics using the parity sector 48. In one embodiment M3 is less than M2, for example, in one embodiment M3 may be one iteration and M2 may be two iterations. In this embodiment, more emphasis is placed on updating the reliability metrics of un-converged codeword(s) using the parity sector 48 as compared to updating the reliability metrics using the Viterbi-type detector 42.

Figure 4B:
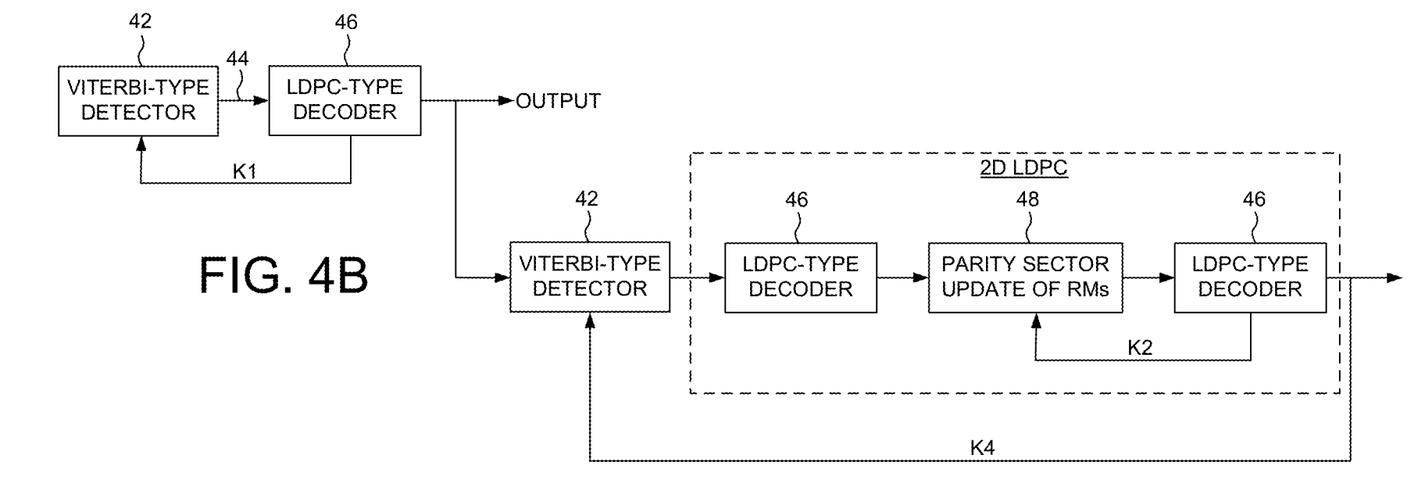
FIG. 4B is a flow diagram according to an embodiment wherein when processing an un-converged codeword, multiple iterations are executed using a parity sector and LDPC decoder between executing a single iteration of a Viterbi-type detector and LDPC decoder.
Figure 5:
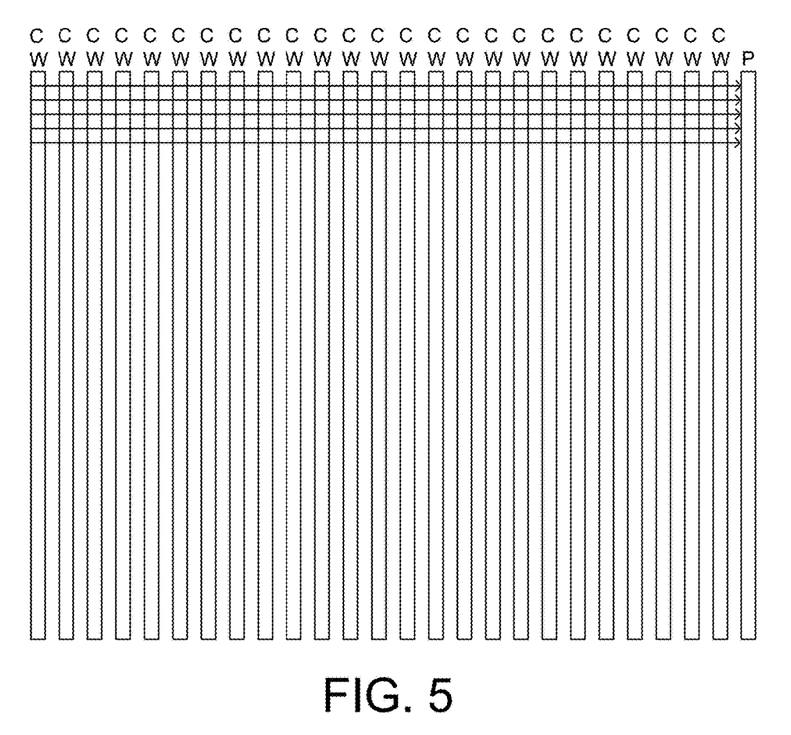
FIG. 5 shows an embodiment wherein the codewords may be processed by the LDPC-type decoder in what is considered a vertical dimension, and the parity sector processed in what is considered a horizontal direction, thereby implementing a 2D LDPC decoding.

FIG. 4B is a flow diagram according to an embodiment wherein when processing the reliability metrics of an un-converged codeword, the reliability metrics are updated using the Viterbi-type detector 42 over K4 outer iterations, and updated using the parity sector 48 and LDPC type decoder 46 over K2 inner iterations, wherein in one embodiment K2 is greater than one thereby emphasizing the parity sector update 48 of the reliability metrics over updating the reliability metrics using the Viterbi-type detector 42. The K2 inner iterations shown in the embodiment of FIG. 4B may be considered a two-dimensional (2D) LDPC type decoding since the parity sector update 48 operates in a first dimension while the LDPC-type decoder 46 operates in a second dimension. An example of this embodiment is shown in FIG. 5 wherein each codeword (CW) may be represented as being LDPC decoded in a vertical dimension whereas the parity sector (P) may be generated over respective symbols of each codeword across a horizontal dimension.

Figure 6:
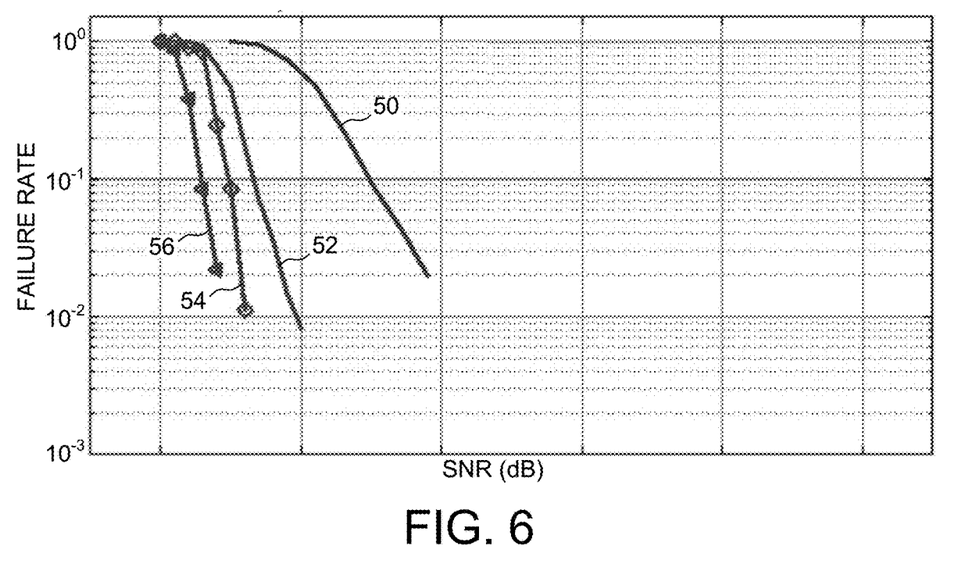
FIG. 6 is a graph showing the performance of the prior art decoding technique of FIG. 3B as compared to different embodiments disclosed herein.

FIG. 6 shows the performance of the prior art decoding technique shown in FIG. 3B without parity sectors (curve 50) and with parity sectors (curve 52) as compared to different embodiments described above. Curve 54 shows the performance improvement when employing sixteen buffers for storing sixteen un-converged codewords using the decoding technique shown in FIG. 4A or 4B. When the number of buffers for storing un-converged codewords is doubled to thirty-two, curve 56 illustrates a further performance improvement when using the decoding technique of FIG. 4A or 4B. Increasing the number of buffers for storing the number of un-converged codewords increases the cost of the control circuitry, and so in one embodiment there is a balancing between the number of buffers employed and the corresponding improvement in performance.

Any suitable technique may be employed to update the LLRs of a codeword using the parity sector. In one embodiment when processing the LLRs of the codewords corresponding to one of the parity sector parity bits, at least one of the LLRs across the un-converged codewords is modified so that the likelihood of a codeword bit flips its binary state, thereby satisfying the parity of the parity sector. When at least one of the LLRs is updated correctly, it improves the likelihood the corresponding codeword will converge during the subsequent processing by the LDPC-type decoder 46. As each un-converged codeword converges, there is a corresponding improvement in the update accuracy of the parity sector, further improving the likelihood of recovering all of the un-converged codewords. A suitable technique for updating the LLRs of un-converged codewords using a parity sector is disclosed in U.S. Pat. No. 9,632,863 entitled "TRACK ERROR-CORRECTION CODE EXTENSION," the disclosure of which is incorporated herein by reference.

In the embodiments described above, a block of codewords may be covered by a single parity sector. In other embodiments, a block of codewords may be covered by multiple parity sectors, for example, by generating a first parity sector over each symbol in a first interleave (e.g., even interleave) of a codeword, and generating a second parity sector over each symbol in a second interleave (e.g., odd interleave) in the codeword. In one embodiment, multiple parity sectors may be generated over different symbol resolutions (e.g., every ½ and every ¼ symbols), and the reliability metrics updated in a cascading manner starting with the lowest resolution parity sector. Examples of this embodiment are disclosed in U.S. patent application Ser. No. 15/161,165 entitled "DATA STORAGE DEVICE DYNAMICALLY GENERATING EXTENDED REDUNDANCY OVER INTERLEAVES OF A DATA TRACK," the disclosure of which is incorporated herein by reference.

Any suitable LDPC-type encoder/decoder may be employed in the embodiments described above. In general, an LDPC-type decoder uses any suitable form of iterative belief propagation techniques. In addition, the LDPC-type decoder may perform any suitable number of iterations before declaring a codeword converged or un-converged, wherein the number of iterations may be considered an ECC system parameter that may be calibrated to achieve optimal performance in terms of accuracy and speed.

Any suitable control circuitry may be employed to implement the flow diagrams in the above embodiments, such as any suitable integrated circuit or circuits. For example, the control circuitry may be implemented within a read channel integrated circuit, or in a component separate from the read channel, such as a data storage controller, or certain operations described above may be performed by a read channel and others by a data storage controller. In one embodiment, the read channel and data storage controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or data storage controller circuit, or integrated into a SOC.

In one embodiment, the control circuitry comprises a microprocessor executing instructions, the instructions being operable to cause the microprocessor to perform the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the NVSM and read into a volatile semiconductor memory when the data storage device is powered on. In yet another embodiment, the control circuitry comprises suitable logic circuitry, such as state machine circuitry.

In various embodiments, a disk drive may include a magnetic disk drive, an optical disk drive, etc. In addition, while the above examples concern a disk drive, the various embodiments are not limited to a disk drive and can be applied to other data storage devices and systems, such as magnetic tape drives, solid state drives, hybrid drives, etc. In addition, some embodiments may include electronic devices such as computing devices, data server devices, media content storage devices, etc. that comprise the storage media and/or control circuitry as described above.

The various features and processes described above may be used independently of one another, or may be combined in various ways. All possible combinations and subcombinations are intended to fall within the scope of this disclosure. In addition, certain method, event or process blocks may be omitted in some implementations. The methods and processes described herein are also not limited to any particular sequence, and the blocks or states relating thereto can be performed in other sequences that are appropriate. For example, described tasks or events may be performed in an order other than that specifically disclosed, or multiple may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

While certain example embodiments have been described, these embodiments have been presented by way of example only, and are not intended to limit the scope of the inventions disclosed herein. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions and changes in the form of the methods and systems described herein may be made without departing from the spirit of the embodiments disclosed herein.

What is claimed is:

1. A data storage device comprising:
a non-volatile storage medium (NVSM); and
control circuitry configured to:
(a) generate a plurality of codewords each comprising a plurality of symbols;
(b) generate a parity sector over the plurality of codewords;
(c) write the plurality of codewords and the parity sector to the NVSM;
(d) read the plurality of codewords and the parity sector from the NVSM;
(e) process each codeword read from the NVSM using a Viterbi-type detector, thereby generating codeword reliability metrics;
(f) iteratively process the codeword reliability metrics for at least some of the codewords using a low density parity check (LDPC) type decoder, thereby generating a LDPC reliability metric for each symbol of at least one codeword;
(g) process the LDPC reliability metrics for at least one of an un-converged codeword using the parity sector, thereby updating the un-converged codeword reliability metrics;
(h) repeat (f) and (g) at least once without updating any of the LDPC reliability metrics using the Viterbi-type detector; and
(i) after repeating (f) and (g) at least once, update the LDPC reliability metrics of at least the un-converged codeword using the Viterbi-type detector.

2. The data storage device as recited in claim 1, wherein at (h) the control circuitry is further configured to repeat (f) and (g) at least twice.

3. The data storage device as recited in claim 1, wherein after (i) the control circuitry is further configured to:
(j) update the reliability metrics of at least the un-converged codeword using the iterative LDPC-type decoder; and
(k) after (j) and before updating any of the LDPC reliability metrics of the un-converged codeword using the parity sector, update the LDPC reliability metrics of at least the un-converged codeword using the Viterbi-type detector.

4. The data storage device as recited in claim 1, wherein the control circuitry is further configured to repeat (g) through (i) at least once.

5. A method of operating a data storage device, the method comprising:
generating a plurality of codewords each comprising a plurality of symbols;
generating a parity sector over the plurality of codewords;
writing the plurality of codewords and a parity sector of a non-volatile storage medium (NVSM);
reading the plurality of codewords and the parity sector from the NVSM;
processing each codeword read from the NVSM using a Viterbi-type detector, thereby generating codeword reliability metrics;
iteratively processing the codeword reliability metrics for at least some of the codewords using a low density parity check (LDPC) type decoder, thereby generating a LDPC reliability metric for each symbol of at least one codeword;

processing the LDPC reliability metrics for at least one of an un-converged codeword using the parity sector, thereby updating the un-converged codeword reliability metrics; and after processing the LDCP reliability metrics for the at least one un-converged codeword using the parity sector, recover the un-converged codeword by processing the reliability metrics for the un-converged codeword N times with the parity sector and M times with Viterbi-type detector, where N is greater than M.

6. The method as recited in claim 5, further comprising processing the reliability metrics of the un-converged codeword using the parity sector at least twice before processing the reliability metrics with the Viterbi-type detector.

7. The method as recited in claim 6, wherein after processing the reliability metrics of the un-converged codeword at least twice using the parity sector, further comprising updating the reliability metrics of at least the un-converged codeword using the Viterbi-type detector.

8. Control circuitry configured to:
(a) process each of a plurality of codewords read from a non-volatile semiconductor memory (NVSM) using a Viterbi-type detector, thereby generating codeword reliability metrics, wherein the NVSM is configured to store a plurality of codewords each comprising a plurality of symbols and a parity sector generated over the plurality of codewords;
(b) iteratively process the codeword reliability metrics for at least some of the codewords using a low density parity check (LDPC) type decoder, thereby generating a LDPC reliability metric for each symbol of at least one codeword;
(c) process the LDPC reliability metrics for at least one of an un-converged codeword using the parity sector, thereby updating the un-converged codeword reliability metrics;
(d) repeat (b) and (c) at least once without updating any of the LDPC reliability metrics using the Viterbi-type detector; and
(e) after repeating (b) and (c) at least once, update the LDPC reliability metrics of at least the un-converged codeword using the Viterbi-type detector.

9. The control circuitry as recited in claim 8, wherein at (d) the control circuitry is further configured to repeat (b) and (c) at least twice.

10. The control circuitry as recited in claim 8, wherein after (e) the control circuitry is further configured to:
(f) update the reliability metrics of at least the un-converged codeword using the iterative LDPC-type decoder; and
(g) after (f) and before updating any of the LDPC reliability metrics of the un-converged codeword using the parity sector, update the LDPC reliability metrics of at least the un-converged codeword using the Viterbi-type detector.

11. The control circuitry as recited in claim 8, wherein the control circuitry is further configured to repeat (c) through (e) at least once.

* * * * *